US009304404B2

(12) United States Patent
Fischer et al.

(10) Patent No.: US 9,304,404 B2
(45) Date of Patent: Apr. 5, 2016

(54) ARRANGEMENT FOR ACTUATING AN ELEMENT IN A MICROLITHOGRAPHIC PROJECTION EXPOSURE APPARATUS

(71) Applicants: Carl Zeiss SMT GmbH, Oberkochen (DE); ASML Netherlands B.V., Veldhoven (NL)

(72) Inventors: Juergen Fischer, Heidenheim (DE); Ulrich Schoenhoff, Ulm (DE); Bernhard Geuppert, Aalen (DE); Hans Butler, Best (NL); Robertus Johannes Marinus De Jongh, Eindhoven (NL)

(73) Assignees: Carl Zeiss SMT GmbH, Oberkochen (DE); ASML Netherlands B.V., Veldhoven (NL)

(*) Notice: Subject to any disclaimer, the term of this patent is extended or adjusted under 35 U.S.C. 154(b) by 186 days.

(21) Appl. No.: 14/059,296

(22) Filed: Oct. 21, 2013

(65) Prior Publication Data
US 2014/0043596 A1 Feb. 13, 2014

Related U.S. Application Data

(63) Continuation of application No. PCT/EP2012/056578, filed on Apr. 11, 2012.

(60) Provisional application No. 61/477,740, filed on Apr. 21, 2011.

(30) Foreign Application Priority Data

Apr. 21, 2011 (DE) .......................... 10 2011 007 917

(51) Int. Cl.
G03B 27/68 (2006.01)
G03F 7/20 (2006.01)

(52) U.S. Cl.
CPC ............ G03F 7/70191 (2013.01); G03F 7/709 (2013.01); G03F 7/70825 (2013.01)

(58) Field of Classification Search
CPC .. G03F 7/70191; G03F 7/70825; G03F 7/709
See application file for complete search history.

(56) References Cited

U.S. PATENT DOCUMENTS 4,123,675 A    10/1978  Moskowitz et al.
6,193,206 B1 *  2/2001  Yasuda ................. F16F 7/1005
                                                188/378

(Continued)

FOREIGN PATENT DOCUMENTS

DE    10 2008 041 310 A1    3/2009
DE    10 2008 026 077 A1    12/2009
WO    WO 2007/006577 A1     1/2007

OTHER PUBLICATIONS

International Preliminary Report on Patentability and Written Opinion of the international searching authority dated Oct. 31, 2013 in international patent application PCT/EP2012/056578 on which the claim of priority is based.

(Continued)

Primary Examiner — Deoram Persaud
(74) Attorney, Agent, or Firm — Walter Ottesen P.A.

(57) ABSTRACT

An arrangement actuates an element in a microlithographic projection exposure apparatus. The arrangement includes first and second actuators and first and second mechanical couplings. The first and second actuators are coupled to the element via corresponding ones of the first and second mechanical couplings for applying respective forces to the element which is regulatable in at least one degree of freedom. The first and second actuators have first and second actuator masses, respectively, and the first actuator mass and the first mechanical coupling conjointly define a first mass-spring system operating as a first low-pass filter. The second actuator mass and the second mechanical coupling conjointly define a second mass-spring system operating as a second low-pass filter. The first and second mass-spring systems have first and second natural frequencies deviating from each other by a maximum deviation equal to 10% of the largest of the first and second natural frequencies.

53 Claims, 11 Drawing Sheets

(56) References Cited

U.S. PATENT DOCUMENTS

| | | | |
|---|---|---|---|
| 6,327,024 B1 * | 12/2001 | Hayashi | F16F 15/02 188/267 |
| 6,788,386 B2 | 9/2004 | Cox et al. | |
| 7,571,793 B2 | 8/2009 | Warmerdam et al. | |
| 7,826,155 B2 | 11/2010 | Geuppert et al. | |
| 8,164,737 B2 | 4/2012 | Butler et al. | |
| 8,885,143 B2 * | 11/2014 | Fischer | G03F 7/70266 355/67 |
| 8,899,393 B2 * | 12/2014 | Kraner | G05B 19/404 188/266.7 |
| 8,908,146 B2 | 12/2014 | Butler | |
| 8,994,919 B2 | 3/2015 | Butler et al. | |
| 9,052,614 B2 * | 6/2015 | Nawata | G03F 7/709 |
| 2003/0197914 A1 | 10/2003 | Cox et al. | |
| 2005/0035684 A1 | 2/2005 | Fuse et al. | |
| 2006/0272910 A1 * | 12/2006 | Kraner | F16F 15/027 188/266.7 |
| 2009/0164051 A1 | 6/2009 | Vervoordeldonk | |
| 2010/0321662 A1 * | 12/2010 | Butler | 355/67 |
| 2011/0299053 A1 | 12/2011 | Steinbach et al. | |
| 2012/0138401 A1 | 6/2012 | Vogler et al. | |

OTHER PUBLICATIONS

Partial English translation and Office action of the German Patent Office dated Dec. 30, 2011 in German patent application 10 2011 007 917.3 on which the claim of priority is based.

English translation and the Office action of the Chinese Patent Office dated Apr. 3, 2015 in the corresponding Chinese patent application 201280019495.1.

English translation of International Search Report and Written Opinion of the international searching authority dated Jul. 4, 2012 in international patent application PCT/EP2012/056578 on which the claim of priority is based.

International Search Report dated Jul. 4, 2012 in international patent application PCT/EP2012/056578 on which the claim of priority is based.

* cited by examiner

ARRANGEMENT FOR ACTUATING AN ELEMENT IN A MICROLITHOGRAPHIC PROJECTION EXPOSURE APPARATUS

CROSS REFERENCE TO RELATED APPLICATIONS

This application is a continuation application of international patent application PCT/EP2012/056578, filed Apr. 11, 2012 which designates the United States and claims priority from U.S. Provisional Application No. 61/477,740 filed Apr. 21, 2011, and German patent application 10 2011 007 917.3 filed Apr. 21, 2011. The present continuation application claims priority to each of the above applications and incorporates herein the entire contents thereof by reference.

FIELD OF THE INVENTION

The invention relates to arrangements for actuating an element in a microlithographic projection exposure apparatus.

BACKGROUND OF THE INVENTION

Microlithography is used to produce microstructured components, such as, for example, integrated circuits or LCDs. The microlithography process is carried out in a so-called projection exposure apparatus, which has an illumination device and a projection lens. The image of a mask (=reticle) illuminated by means of the illumination device is in this case projected by means of the projection lens onto a substrate (for example, a silicon wafer) coated with a light-sensitive layer (photoresist) and arranged in the image plane of the projection lens, in order to transfer the mask structure to the light-sensitive coating of the substrate.

In a projection exposure apparatus designed for EUV (that is, for electromagnetic radiation having a wavelength of less than 15 nm), owing to light-transmissive materials not being present, mirrors are used as optical components for the imaging process. The mirrors can be fixed on a carrier frame and can be configured such that they are at least partly manipulatable, in order to enable a movement of the respective mirror in, for example, six degrees of freedom (that is, with regard to displacements in the three spatial directions x, y and z, and also with regard to rotations $R_x$, $R_y$ and $R_z$ about the corresponding axes), as a result of which it is possible to compensate for changes in the optical properties that occur for instance during the operation of the projection exposure apparatus, for example, on account of thermal influences.

During the operation of EUV systems, dynamical aspects are of increasing importance, for instance when suppressing parasitic forces on the respective elements or when taking account of and suppressing vibrations excited by the system. To this end, a contributing factor is, inter alia, that the natural frequency spectra of the mechanical structures shift ever further to lower frequencies for the growing dimensions of the mirrors and of the support and measurement structures, which dimensions increase with numerical aperture. As a result, vibrations that occur lead to growing problems in respect of the system performance and also in respect of the fact that active position regulation can no longer be operated in a stable manner or only with low control quality.

The prior art has disclosed various approaches for suppressing or damping unwanted vibrations. To this end, reference is made in an exemplary manner to U.S. Pat. No. 7,826,155, WO 2007/006577 A1, DE 10 2008 041 310 A1, United States patent application publication 2012/0138401 and U.S. Pat. No. 4,123,675.

SUMMARY OF THE INVENTION

It is an object of the present invention to make available arrangements for actuating an element in a microlithographic projection exposure apparatus, which allow the position of the element to be regulated with higher control quality.

According to one aspect, the invention relates to a control loop in a microlithographic projection exposure apparatus, including: at least one position sensor for generating a sensor signal characteristic for the position of an element in the projection exposure apparatus; at least one actuator; a closed-loop controller, which regulates a force exerted on the element by the actuator as a function of the sensor signal from the position sensor; and, at least one low-pass filter present in the control loop for the purpose of stabilizing the control response.

The invention is firstly based on the concept of arranging a low-pass filter in a control loop containing an arrangement for actuating an element, more particularly a mirror, and, in doing so, ensuring sufficient stability when regulating the position of the element or the mirror position by suitably adjusting the resonant and filter frequencies that occur in the system.

Although the following text assumes a mirror as the element and also a projection exposure apparatus designed for EUV, the invention is not restricted thereto. Thus, the invention can also be implemented in conjunction with other (more particularly optical) elements (such as, for example, lenses) and/or in a projection exposure apparatus designed for DUV (that is, for wavelengths of less than 200 nm, more particularly of less than 160 nm).

The use according to the invention of a low-pass filter in a control loop is not readily obvious to the extent that such a low-pass filter is accompanied by a change in the phase profile, more particularly by a reduction in the phase margin of the control loop; this can best be identified from FIGS. 5A and 5B. The illustrations in FIGS. 5A and 5B show an exemplary transfer function of the action-force suppression (FIG. 5A) and the corresponding phase response (FIG. 5B), with the effect of the damping of such a filter being exemplified on the basis of the curves for two different Q-factors.

In principle, the suppression of the actuator forces in second order filters depends on the relative spacing between the excitation frequency and the filter frequency; this can be identified in FIG. 5A. Excitations in the frequency range below the filter frequency are not suppressed. Above the filter frequency, the actuator forces are ever more suppressed with an increase of −40 dB/decade. As the damping increases, the resonance sharpness that occurs in the vicinity of the filter frequency is reduced to below the stiffness or mass line. The Q-factor describes the size of the resonance peak, with FIG. 5A illustrating the profiles for comparatively weak damping (large resonance peak, Q=250) and for comparatively strong damping (small resonance peak, Q=0.7). If the filter is implemented by mechanical means, the filter frequency $f_F$ is in this case given by $$f_F = \frac{1}{2\pi} \cdot \sqrt{\frac{k}{m}}, \qquad (1)$$

where k denotes the spring constant of the spring-mass system which forms the mechanical filter and m denotes the filter mass of the mechanical filter.

As per FIG. 5B, there is a phase shift of 180° (corresponding to a change of sign) from the output to the input signal in the vicinity of the filter frequency in the case of undamped or weakly damped resonance. In the case of stronger damping (in turn corresponding to the dashed curve for Q=0.7 in FIG. 5B), there is a substantially softer transition from a phase of 0° (that is, "input and output signal in phase") to a phase of 180°, and so there already is a significant phase shift for frequencies below the resonance frequency, as a result of which the required reaction of the control loop is no longer sufficiently quick enough. The upshot of this is that, in respect of the above-described phase profile, a low-pass filter with relatively strong damping in a control loop is undesirable per se.

Proceeding from these ideas, the invention is now based on the further discovery that a low-pass filter can be used in a control loop containing an arrangement for actuating an element or a mirror, which low-pass filter has comparatively weak damping (that is, in comparison to conventional electronic filters, which can, for example, have a Q-factor of 0.7), corresponding to a relatively large Q-factor of 5 or more. As will still be explained in more detail below with reference to the figures, a significant resonance, which would be suppressed by using a low-pass filter with a substantially lower Q-factor or stronger damping, is deliberately accepted in the vicinity of the filter frequency as a result of using such a low-pass filter with comparatively weak damping.

However, the inventors have discovered that this additional resonance in the vicinity of the filter frequency can be constructed such that the control loop nevertheless is stable and exhibits the wanted control quality. In other words, the additional resonance in the vicinity of the filter frequency does not cause deterioration in the performance, to the extent that it is suitably constructed in a targeted manner, and so the resonance does not cause instability in the control loop. As a result, the low-pass filter can thus continue to suppress the resonant frequencies of the element or the mirror, with, at the same time, the above-described unwanted effect of phase loss being avoided—unlike the case where a low-pass filter with strong damping or low Q-factor is used.

The resonant frequencies of the element or the mirror, that is, the flexible eigenmodes of the element body or mirror body, are generally visible in the transfer functions of the mirror control loops as weakly-damped resonance spikes. There they limit the achievable bandwidth, that is, the control quality, of the closed-loop control (as will still be seen below in FIG. 2 for the case without a filter).

The filter frequency of the low-pass filter is preferably less than 95%, in particular less than 80%, more particularly less than 60%, of the value of the smallest natural frequency of the mirror.

This embodiment is advantageous inasmuch as that, as already explained on the basis of FIG. 5A, the effectiveness of suppressing a specific resonant frequency of the mirror by means of a filter increases, the lower the filter frequency of the filter (that is, the natural frequency of the mass-spring system in the case of a mechanical filter) is. At the same time, the filter frequency is not, according to the invention, set arbitrarily low so that the stability of the control loop is maintained. Hence the filter frequency should preferably lie by at least a factor of 4-5 above the bandwidth. In end effect, the bandwidth in this case determines the control quality when positioning the element or the mirror and the ability to suppress external interference (for example, as a result of movement of the wafer table et cetera).

The low-pass filter can be embodied as an electronic filter and can more particularly have an electric or electronic circuit in the closed-loop controller, the position sensor or the actuator.

In further embodiments, the low-pass filter is embodied as a mechanical filter.

First of all, a mechanical filter formed by a mass-spring system naturally has comparatively weak damping or a high Q-factor, as sought after within the scope of the invention.

Moreover, implementing the low-pass filter as a mechanical filter in the form of a mass-spring system now has the additional advantage that the mechanical filter can be implemented such that it comprises an actuator mass belonging to the actuator, for example—if the actuator is embodied as voice-coil motor or Lorentz actuator—the mass of the magnet of this actuator, which then, together with the mechanical coupling of the actuator mass to the mirror, already forms a mass-spring system and hence the relevant mechanical filter. In such an embodiment, the mass of the relevant actuator component is no longer attached to the mirror by adhesion techniques or the like, which are accompanied by deformations, or attached to the mirror by means of an elastic connection serving to decouple such deformations, but rather it is decoupled from the mirror in a targeted manner by the spring of the mass-spring system that forms the low-pass filter.

This decoupling of this actuator mass from the mirror, brought about by coupling the actuator mass to the mirror via a spring, now leads to an increase in the resonant frequency of the mirror, as will be explained in more detail below with reference to the figures, which can be traced back to the omission of the magnet mass and the reduction in the effectively vibrating mass accompanying this, with the filter frequency of the filter remaining unchanged, for instance compared to a low-pass filter, implemented as an electronic filter, with the same damping.

Overall this once again increases the effectiveness of the low-pass filter since (as already explained on the basis of FIG. 5A) the suppression of the low-pass filter increases with increasing value of the frequency to be suppressed or with the increasing spacing of the latter from the filter frequency.

In embodiments of the invention, the mechanical filter can comprise the position sensor, an actuator mass belonging to the actuator or the mechanical coupling of the actuator mass to the mirror. Moreover, the mechanical coupling of the actuator mass to the element or the mirror can have a pin. Moreover, in embodiments of the invention, the ratio of the stiffness of the mechanical coupling in the axial direction, with respect to the drive axle of the actuator, to the stiffness in the lateral direction is at least 100. To this end, the pin can more particularly be provided with two flexure bearings.

In embodiments, each actuator controlled by the closed-loop control has its own mechanical coupling to the element or mirror, with no further actuator coupling onto said mechanical coupling. An advantage of this embodiment is that the natural frequencies of the mass-spring systems, which are associated with the respective actuators (and are, for example, embodied in conjunction with the pin), can be dimensioned individually, and so, more particularly, all natural frequencies can be adjusted to the same value.

According to a further aspect of the invention, an arrangement for actuating an element in a microlithographic projection exposure apparatus includes: at least two actuators, which are respectively coupled to the element via a mechanical coupling and respectively exert a force on the element that can be regulated in at least one degree of freedom; wherein, for each of these actuators, an actuator mass belonging to the respective actuator forms a mass-spring system, which acts as a low-pass filter, with the mechanical coupling associated with the actuator; and, wherein the natural frequencies of these mass-spring systems have a maximum deviation from one another that is equal to 10% of the largest of these natural frequencies.

This approach accounts for the circumstance that if not only one but a number of different filter frequencies (for different drive axles of the actuators) are present in the arrangement, an adjustment or reduction in the bandwidth may, if need be, have to be undertaken in specific axles such that the desired control quality is no longer achieved. Within the meaning of a best-possible compromise between filter effect and control quality, it is therefore advantageous if the filter frequencies lie together as closely as possible. By tuning the filter frequencies to substantially the same value, a more stable closed-loop control of the element or mirror position in the actuator is made possible as a result, while taking account of the frequencies that occur in the system.

The two actuators preferably have mutually perpendicular drive axles. Such an arrangement is advantageous in that a quenching effect of the actuators with respect to one another and instability of the closed-loop controller accompanying such a quenching effect can be excluded.

The two actuators can more particularly form a bipod.

According to one embodiment, the natural frequency of the mass-spring systems forming the low-pass filter is respectively less than 95%, in particular less than 80%, more particularly less than 60%, of the value of the smallest natural frequency of the element or mirror.

This in turn is based on the idea that the effectiveness of suppressing a specific resonant frequency by means of a filter increases the lower the filter frequency of the filter is (that is, the natural frequency of the mass-spring system in the case of the mechanical filter).

This embodiment is advantageous, independently of the above-described, best-possible correspondence of the filter frequencies if a number of low-pass filters are present.

According to a further aspect, the invention therefore also relates to an arrangement for actuating an element in a microlithographic projection exposure apparatus, including: at least one actuator, which is coupled to the element via a mechanical coupling and exerts a force on the element that can be regulated in at least one degree of freedom; wherein an actuator mass belonging to the actuator forms a mass-spring system, which acts as a low-pass filter, with the mechanical coupling associated with the actuator; and, wherein the natural frequency of the mass-spring system is less than 95% of the value of the smallest natural frequency of the element.

In this case, the natural frequency of the mass-spring system of the low-pass filter is preferably also less than 80%, in particular less than 70%, more particularly less than 60% and more particularly 50%, of the value of the smallest natural frequency of the element or mirror.

The low-pass filter used according to the present invention can alternatively, or in addition thereto, also be formed by a sensor system present in the control loop (or also formed therewith), with this sensor system comprising an elastic spring element.

As per a further aspect, the invention therefore relates to an arrangement for actuating an element in a microlithographic projection exposure apparatus, including: at least one sensor element for determining the position and/or bearing of the element in at least two degrees of freedom, the sensor element being coupled to the element or to a reference structure via a mechanical coupling; wherein, for the at least two degrees of freedom, the sensor element respectively forms a mass-spring system, which acts as a low-pass filter, with the mechanical coupling; and, wherein the natural frequencies of these mass-spring systems have a maximum deviation from one another that is equal to 10% of the largest of these natural frequencies.

According to this aspect, the invention proceeds from the idea that the low-pass filter according to the invention can, in principle, be installed anywhere in a control loop (as will be explained in more detail below with reference to the figures), that is, also at the site of a position sensor contained in the control loop. By way of example, such a position sensor can have a scale or target applied to the element or mirror, which scale or target can be read by the sensor head and can be assembled on a suitable spring system and can vibrate with a spring frequency, as a result of which a mechanical filter can likewise be implemented. As a result of the smaller sensor grating mass m, the stiffness k of the sensor connection can also be smaller, which is required for implementing the filter frequency required for the respective degree of freedom.

According to a further aspect, the invention relates to an arrangement for actuating an element in a microlithographic projection exposure apparatus, including: at least one sensor element for determining the position and/or bearing of the element in at least one degree of freedom, the sensor element being coupled to the element or to a reference structure via a mechanical coupling; wherein, for the at least one degree of freedom, the sensor element forms a mass-spring system, which acts as a low-pass filter, with the mechanical coupling; and, wherein the natural frequency of this mass-spring system is less than 95% of the value of the smallest natural frequency of the element.

According to one embodiment, the respective low-pass filter has a Q-factor of at least 5, in particular of at least 20, more particularly of at least 50 and more particularly of at least 80. This approach in turn proceeds from the discovery, already described above, that phase in the low-frequency range is "lost" in the case of too strong damping in the low-pass filter, and so the element or the mirror only follows the controller output with time delay, which ultimately leads to deterioration of the control quality.

According to one embodiment, the arrangement has six actuators for actuating the element or the mirror in respectively one degree of freedom.

The invention furthermore relates to a microlithographic projection exposure apparatus with an arrangement or a control loop with the above-described features.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
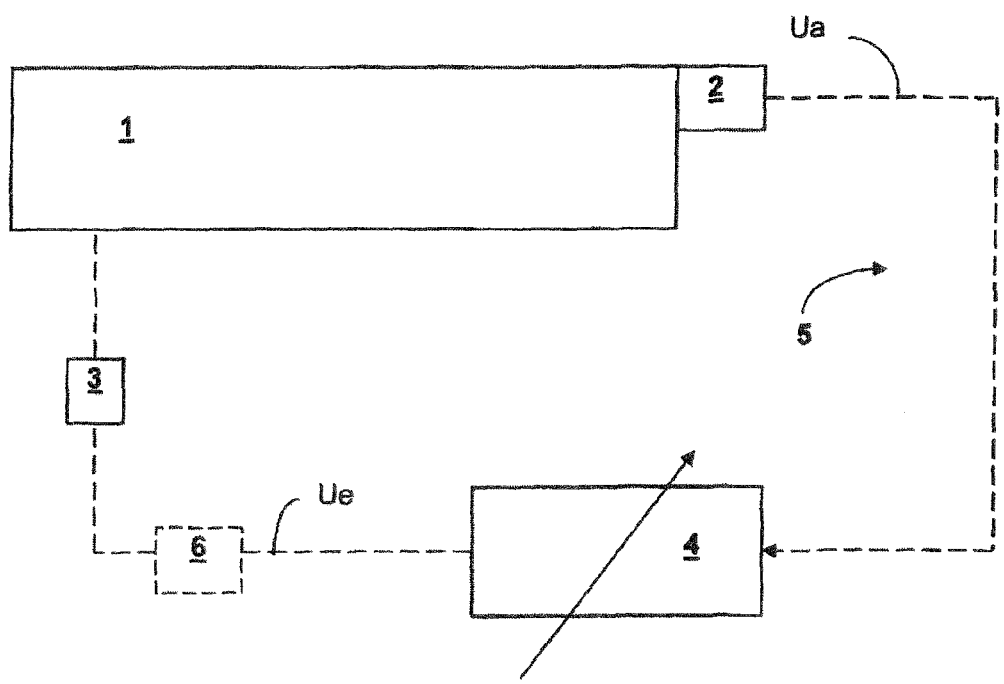
FIG. 1 shows a schematic of a control loop, in which the invention can be implemented.

FIG. 1 shows a control loop with an EUV mirror 1, a position sensor 2 for measuring the mirror position and an actuator 3 for setting the mirror coordinates in at least one degree of freedom. Furthermore, a closed-loop controller 4 is illustrated schematically, with the input of the closed-loop controller 4 being supplied with the signals from the position sensor 2 (denoted by Ua). On the output end of the closed-loop controller 4, a signal for controlling the actuator 3 is outputted, with this controller output being denoted by Ue.

Now, a low-pass filter can be installed into this control loop at, in principle, any position, for example at the position denoted by "6" as per FIG. 1. The effect of such a low-pass filter is explained below for different implementations of the low-pass filter with reference to FIGS. 2 to 4C.

Starting from FIG. 1, each of FIGS. 2 to 4C initially describe the open control loop on the basis of Bode and Nyquist plots for the closed-loop control each along one axis (that is, mirror, position sensor, closed-loop controller and actuator are connected in series). In the Bode plots as per FIGS. 2A, 2B; 3A, 3B; and, 4A, 4B, the frequency, plotted on the horizontal axis, is normalized with respect to the bandwidth in each case, the bandwidth corresponding to that frequency at which the gain of the open control loop is one (corresponding to 0 dB), that is, the closed-loop controller is able to suppress noise. Above the bandwidth, the gain reduces to a value of less than 1, and so the closed-loop controller is no longer effective.

The Bode plots each illustrate the frequency response of the open control system as per FIG. 1, that is, the time shift between input and output variable as a function of the frequency. In order to illustrate the stability of a control system, use is furthermore made of the Nyquist plot, as shown, for example, in FIG. 2C, in which the imaginary part Im(Ua/Ue) and the real part Re(Ua/Ue) are illustrated.

Figures 2A, 2B:
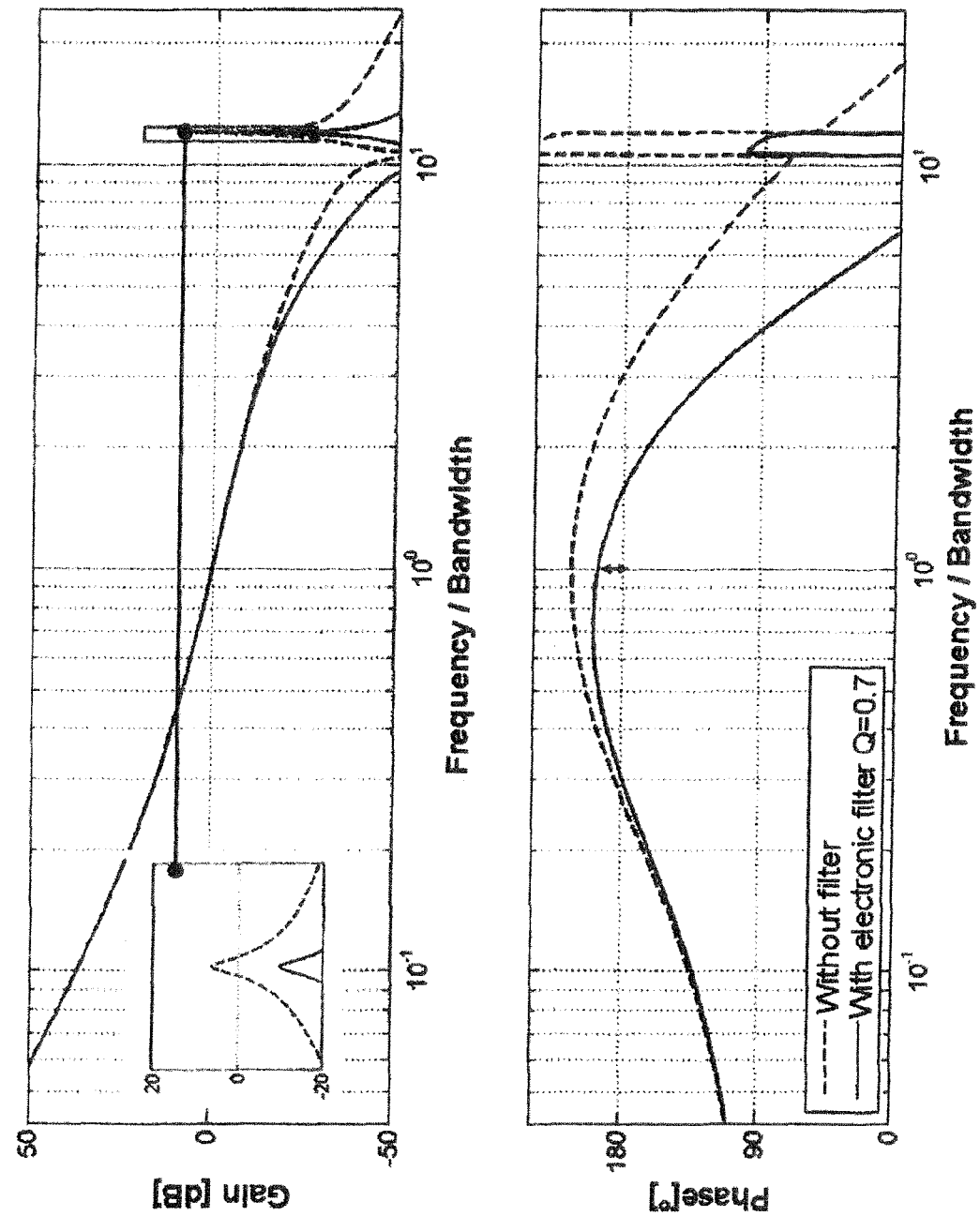
FIGS. 2A to 2C show Bode-plots (FIGS. 2A and 2B) with associated Nyquist-plot (FIG. 2C) of the open control loop for a control loop without low-pass filter and for a low-pass filter with strong damping.

Specifically, FIG. 2A illustrates the gain, plotted on a logarithmic scale, of the control loop (corresponding to the ratio between output variable Ua and input variable Ue of the closed-loop controller) as a function of the frequency, which is normalized with respect to the bandwidth and likewise plotted on a logarithmic scale, with Ua denoting the position of the mirror established by the position sensor 2 and Ue being the controller output of the actuator 3. The phase of the control loop is illustrated in the Bode plot of FIG. 2B. The Bode and Nyquist plots can now be used to establish how the open control loop must be configured such that the closed-loop control is stable when the control loop is closed.

Figure 2C:
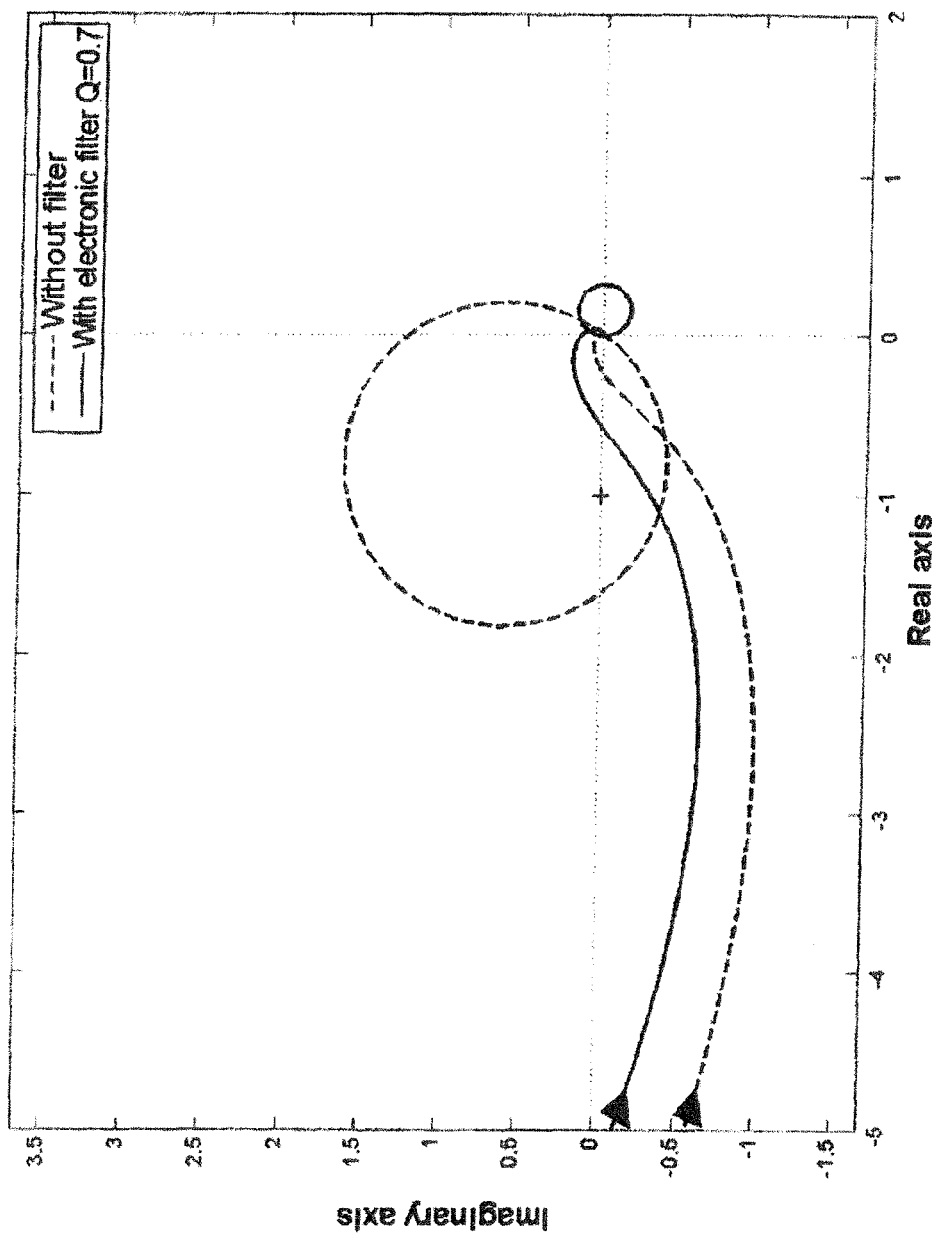

With reference first to FIGS. 2A to 2C, the effects of installing a low-pass filter, implemented electronically, with comparatively strong damping are explained first of all, with the curves obtained for such a low-pass filter in each case being illustrated by a full line. Here, the dashed line in FIGS. 2 to 4C in each case illustrates those curves in the Bode or Nyquist plot which emerge if no low-pass filter is installed in the control loop and thus serve as reference curves in the following text.

The solid line in FIGS. 2A and 2B corresponds to the installation of a low-pass filter with a comparatively low Q-factor, that is, with strong damping, in the control loop of FIG. 1 (for example, between closed-loop controller 4 and actuator 3). Here, as per FIGS. 2A to 2C, a typical electro-technical filter with a Q-factor of 0.7 has been selected (second order Butterworth filter).

According to FIG. 2A, there is a pronounced resonance in the reference curve without low-pass filter at a frequency of just over 10-times the bandwidth, at which the gain rises to a value above 1 (that is, over 0 dB). The mirrors are usually designed such that the lowest natural frequency thereof is greater than 1 kHz. By coupling the actuator to the mirror, these natural frequencies reduce, which can have an interfering effect on the control response.

As a result of using the low-pass filter, the gain in the vicinity of the resonant frequency is reduced to a gain factor of less than one (corresponding to a value of less than 0 dB); this can be identified in the magnified section of FIG. 2A. As a result, the instability of the control loop resulting from this resonance is avoided, irrespective of the phase thereof.

In the Nyquist plot, FIG. 2C shows the corresponding frequency profiles plotted in a complex plane of the amplitudes.

In FIG. 2C, the resonance of the mirror corresponds to the circular section of the curve, in which this once again increases until a gain of zero is reached. If this curve now surrounds the so-called critical point (−1, 0) in the Nyquist plot, it is possible to predict that the system exhibits unstable behavior. It can be seen from FIG. 2C that, for the selected low-pass filter, the curve does not surround the point (−1, 0) in the Nyquist plot, and so the system still exhibits stable behavior. However, it can be identified in FIG. 2B that the spacing between the curve corresponding to the installation of the low-pass filter with strong damping and the 180°-value reduces at a frequency corresponding to the bandwidth. This spacing is also referred to as the "phase margin". The reduction in the phase margin corresponds to the smaller distance from the point (1, 0) in the Nyquist plot of FIG. 2C. In order to restore the sought after phase margin, the bandwidth, and hence the control quality of the control loop, must now be reduced.

Figure 5A:
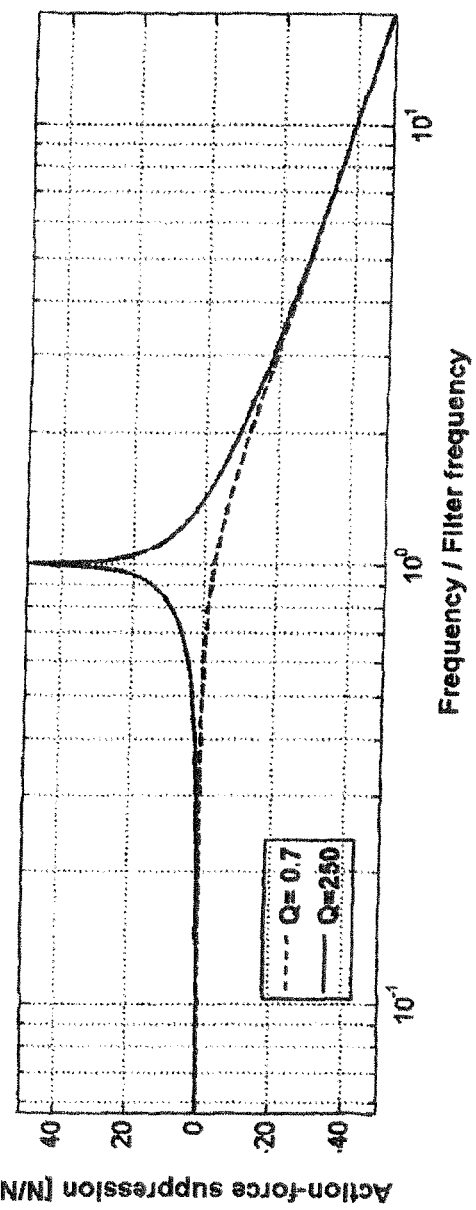
FIGS. 5A and 5B show diagrams for explaining the filter effect of a filter depending on the position of the frequency to be damped relative to the filter frequency for different levels of damping; and, FIGS. 6 to 9B show schematics for explaining various embodiments of the invention.
Figure 5B:
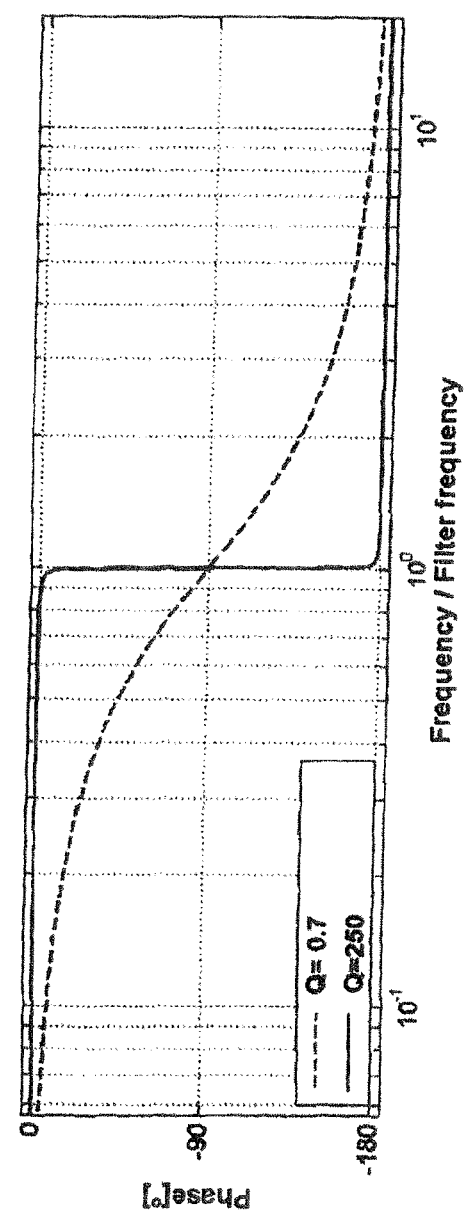

Here, the strong damping of the low-pass filter used as per FIGS. 2A to 2C undesirably already brings about a significant phase shift for frequencies below the resonant frequency in accordance with the effect explained above on the basis of FIG. 5B, resulting in the fact that the required reaction in the control loop is no longer sufficiently quick enough because there already is a continuously increasing phase loss at frequencies far below the bandwidth.

Hence, although a lowest possible value of the filter frequency and, in order to avoid too strong resonance sharpness, a low Q-factor are sought after in respect of the effective suppression of the occurring mirror resonant frequencies, the phase loss accompanying these demands must also be taken into account within the scope of the invention and an appropriate compromise must be found for the control loop.

In the following text, the effect of selecting weaker damping (that is, a higher Q-factor) for the low-pass filter is explained on the basis of FIGS. 3A to 3C.

Figures 3A, 3B:
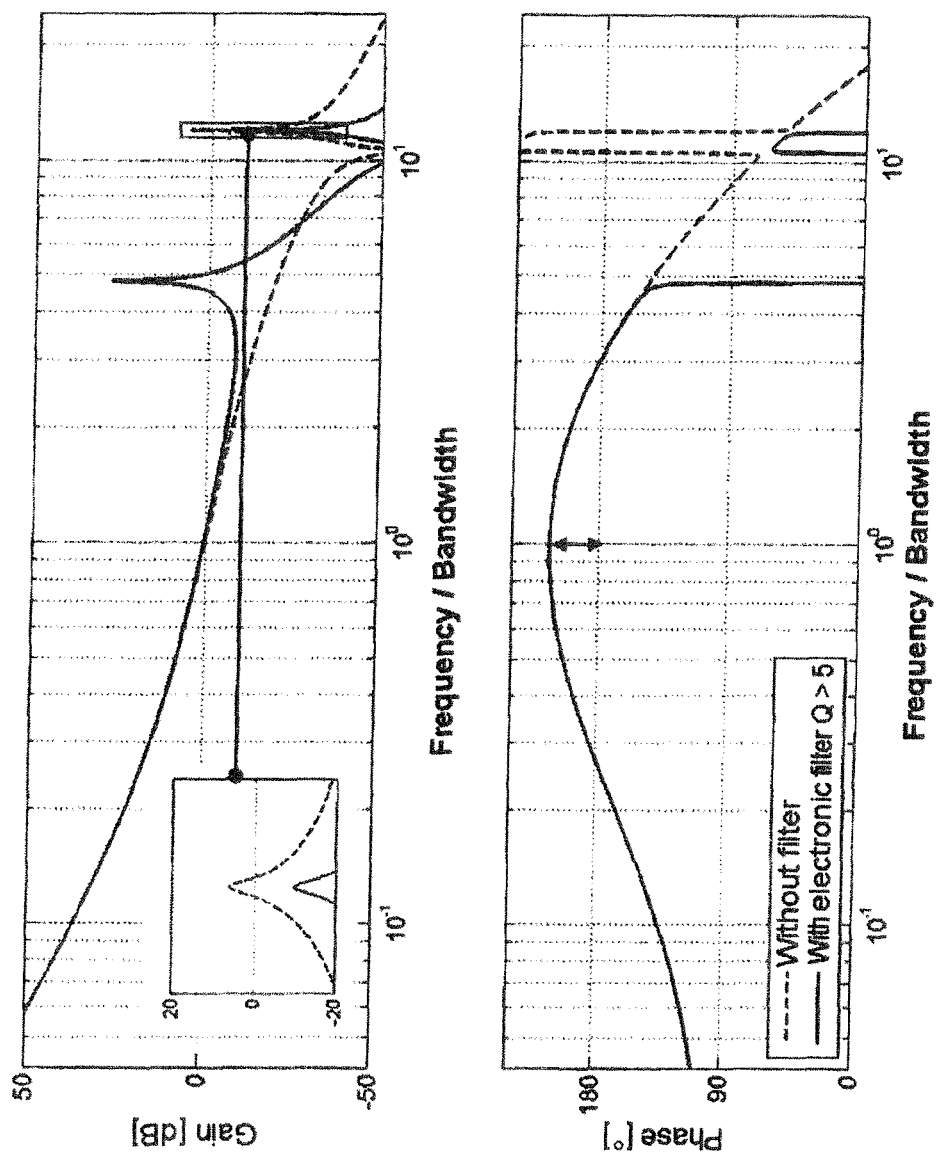
FIGS. 3A to 3C show Bode-plots (FIGS. 3A and 3B) with associated Nyquist-plot (FIG. 3C) of the open control loop for a control loop without low-pass filter and for a low-pass filter with weak damping.
Figure 3C:
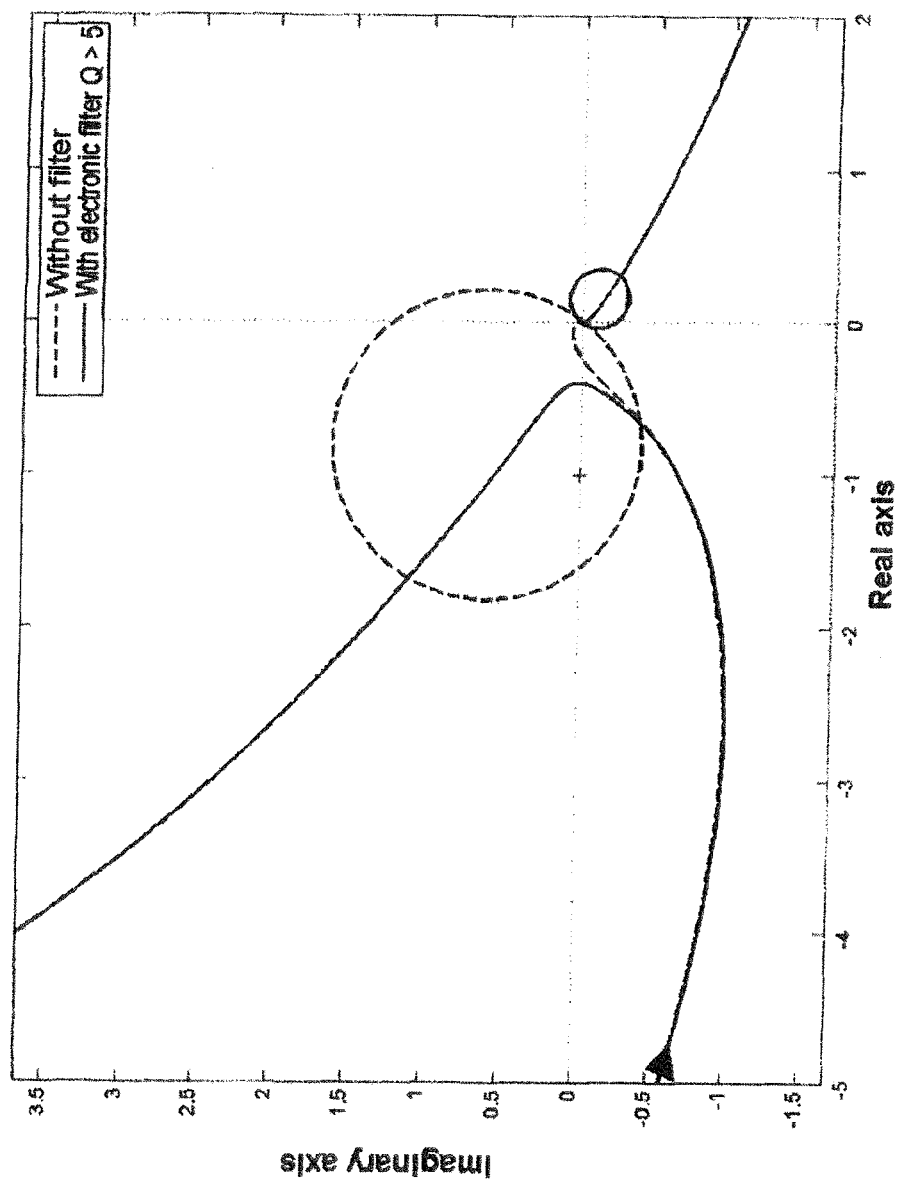

Firstly, FIGS. 3A to 3C illustrate plots that are analogous to FIGS. 2A to 2C for the same reference (without filter), but are now compared to a low-pass filter which has significantly weaker damping. In FIGS. 3A to 3C, this Q-factor is now selected to be (preferably substantially) greater than 5, typically, for example, of the order of 100. While the suppression of the resonant frequency of the mirror is practically unchanged compared to FIG. 2A, there now is a significant resonance in the vicinity of the filter frequency (likewise corresponding to the effect explained above on the basis of FIG. 5B), that is, below the resonant frequency of the mirror.

This resonance was suppressed, or could not be identified, in FIG. 2A as a result of the significantly lower Q-factor in that case.

However, this additional resonance in the vicinity of the filter frequency can now be configured such that the control loop nevertheless exhibits stability and the wanted performance. This is because, as can be identified in the Nyquist plot from FIG. 3C, the curve belonging to the control loop with low-pass filter (illustrated by a full line) now, without the occurrence of a significant phase loss, initially runs along the (dashed) curve for the control loop without low-pass filter, with a large circle (which leaves the diagram or can only be identified in rudimentary manner) then corresponding to the resonance in the vicinity of the filter frequency; this does not enclose the point (−1, 0) in the Nyquist plot, and so the system exhibits stability. In other words, the additional resonance in the vicinity of the filter frequency does not cause a problem since it is at a frequency at which it does not cause instability as a result of the phase of the control loop.

As a result, a suppression of the resonant frequency of the mirror continues to be obtained, with however the unwanted effect of the phase loss being avoided, unlike in the case of the low-pass filter with strong damping or low Q-factor from FIGS. 2A to 2C. In end effect, avoiding this phase loss is achieved by virtue of the fact that the installed low-pass filter, analogously to FIG. 5A (as a result of the increased Q-factor), has a strong resonance sharpness in the vicinity of the filter frequency. The reduction in the phase loss, or the avoidance thereof, in turn leads to the control loop, which is equipped with the low-pass filter, having a reduced tendency toward instability. Thus, according to the invention, suppressing the resonant frequency of the mirror is achieved without this being at the expense of the phase margin.

The filters described above with reference to FIGS. 2A to 2C and FIGS. 3A to 3C can more particularly be installed into the control loop from FIG. 1 as an electronic filter, for instance at the position indicated by dashed lines and as denoted by the reference sign "6".

However, the filter according to the invention can also be implemented mechanically, to be precise by the force of the actuator 3 being exerted onto the mirror via a mass-spring system. Here, a mass belonging to the actuator (for example, the mass of the magnet in a voice-coil motor) can act as mass, and so all that is required is an additional spring between actuator 3 and mirror. Naturally, a mechanical filter formed by such a mass-spring system has weak damping or a high Q-factor.

Implementing the filter as a mechanical filter in the form of a mass-spring system now has the additional advantage that the mass of the relevant actuator component (for example, of the magnet if the actuator is implemented as voice-coil motor) is no longer attached to the mirror by means of adhesive techniques or the like, which are accompanied by deformations, or attached by an elastic connection to the mirror serving to decouple such deformations, but rather it is decoupled from the mirror in a targeted manner by the spring of the mass-spring system.

In the following text, the effect of implementing the low-pass filter as a mechanical filter with weak damping is explained on the basis of FIGS. 4A to 4C.

Figure 4A:
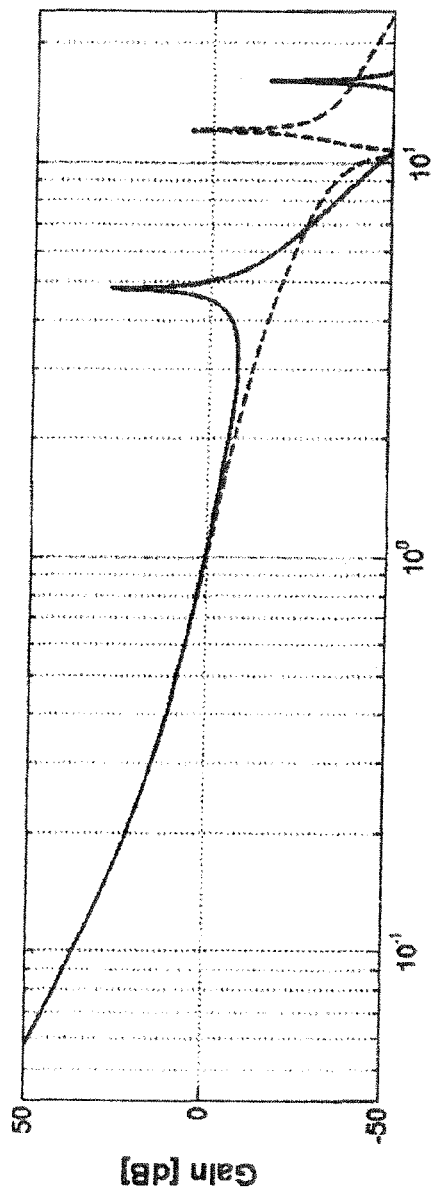
FIGS. 4A to 4C show Bode-plots (FIGS. 4A and 4B) with associated Nyquist-plot (FIG. 4C) of the open control loop for a control loop without low-pass filter and for a low-pass filter, implemented mechanically, with weak damping.
Figure 4B:
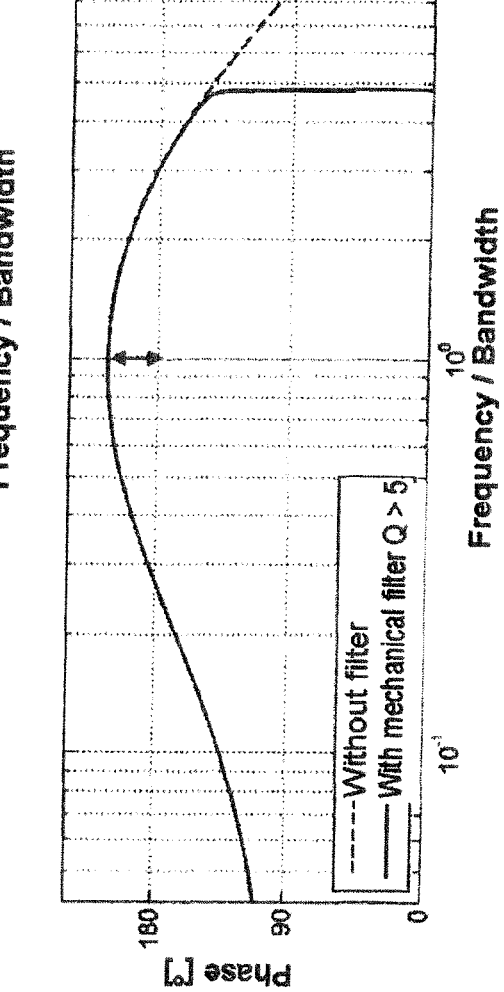
Figure 4C:
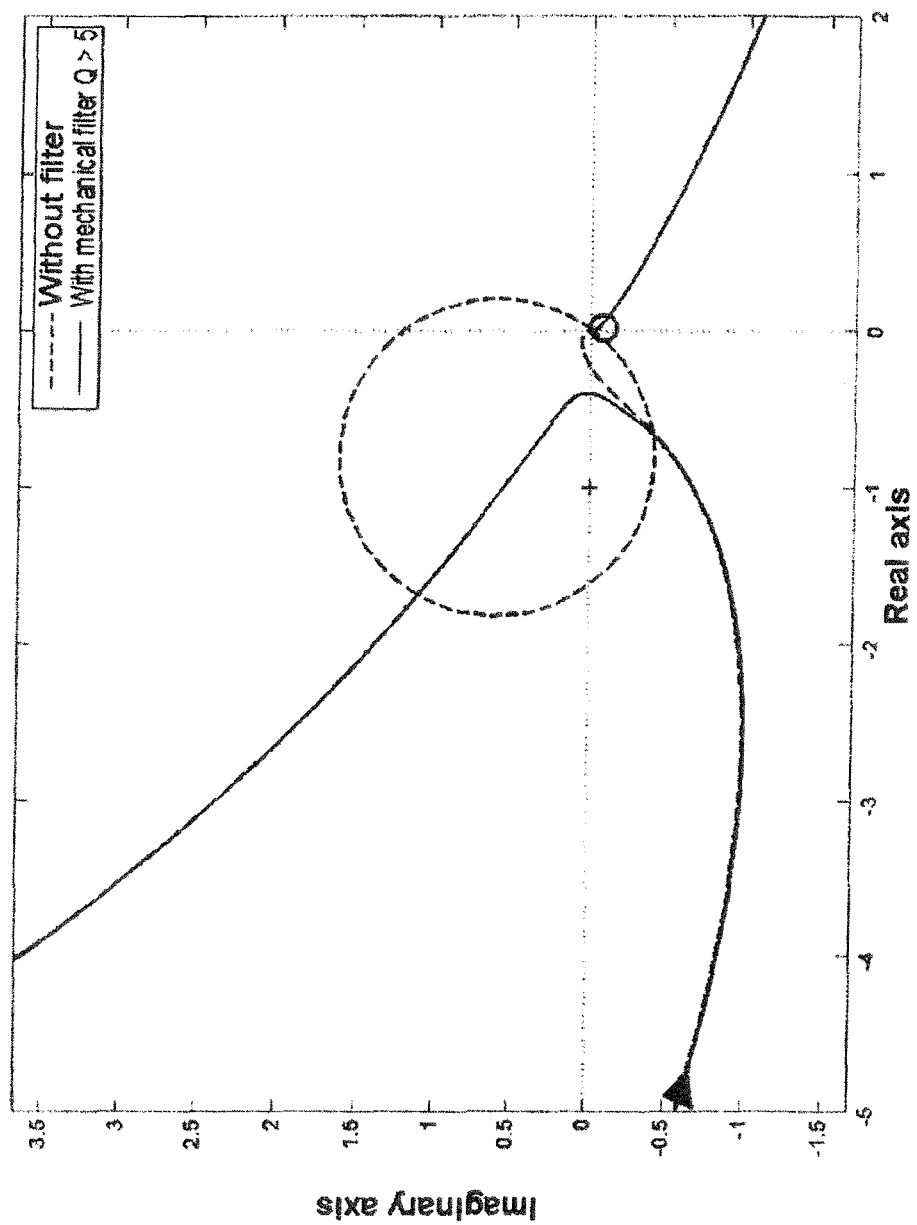

FIGS. 4A to 4C now show plots, analogous to FIGS. 2A to 2C and FIGS. 3A to 3C, in the form of Bode plots in FIGS. 4A and 4B and the Nyquist plot in FIG. 4C for an exemplary embodiment of such a mechanical filter.

The decoupling of this actuator mass from the mirror, achieved by coupling the actuator mass to the mirror by means of a spring, leads, as can be seen from FIG. 4A, to a higher resonant frequency of the mirror (compared to the reference curve, still illustrated by a dashed line, analogous to FIGS. 2A to 2C and FIGS. 3A to 3C), which can be traced back to the omission of the mass of the magnet and the reduction in the effectively vibrating mass accompanying this. As per FIG. 4A, the resonant frequency of the mirror is in this case increased to a value of the order of 15-20-times the frequency corresponding to the bandwidth. Here, the filter frequency of the filter remains unchanged compared to the above-explained exemplary embodiment of FIGS. 3A to 3C. The bandwidth, and hence the control quality, of the control loop can now be further increased.

The Nyquist plot obtained for the exemplary embodiment of FIGS. 4A to 4C, as per FIG. 4C, merely differs from the one from FIG. 3C in that the circular section, corresponding to the resonance of the mirror, of the curve illustrated by the full line (corresponding to the installation of the mechanical filter) has a significantly smaller radius. Hence the effectiveness of the filter in the exemplary embodiment of FIGS. 4A to 4C is once again increased compared to the exemplary embodiment from FIGS. 3A to 3C since (as can be seen from FIG. 5A) the suppression of the filter increases with increasing value of the frequency to be suppressed or with the increasing distance thereof from the filter frequency.

Although the embodiments described above in each case considered the actuation only in one degree of freedom or along one axis, the mirror in practice has six degrees of freedom, in which it can more particularly also be actuated by means of six actuators or loaded by a force that can be regulated. Here, each of these actuators is preferably decoupled at the same frequency. This can now be implemented by virtue of providing an individual spring for each of the total of six actuators, via which spring the respective actuator is attached to the mirror, such that the filter frequency can then be individually selected for each actuator and, more particularly, all filter frequencies can be selected to correspond to one another.

Figure 6:
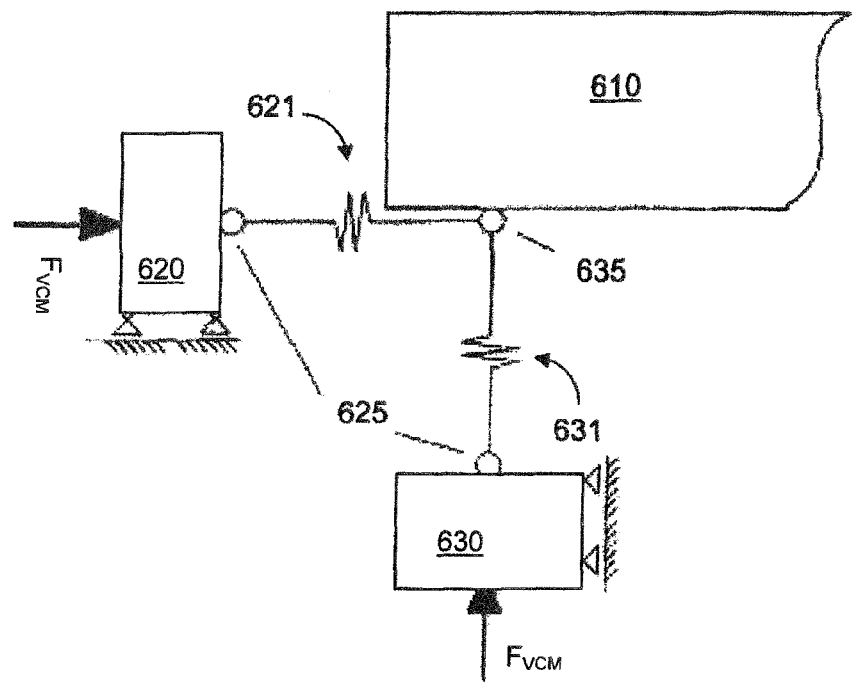

FIG. 6 schematically shows such an implementation for two actuators, embodied as voice-coil motors, in which the drive direction of the first actuator 620 runs in the horizontal direction and the drive direction of the second actuator 630 runs in the vertical direction. The springs utilized between the actuators (620, 630) and the mirror are denoted by "621" and "631" and are embodied as pins. Each of these pins has two joints, which are denoted by "625" and "635" and ensure decoupling of all forces and torques that are not along the drive axle of the pins. The joints (625, 635) can be embodied as simple flexible pin, cardan joint or else as a parallel spring joint with additional tilt joint. Moreover, the joints (625, 635) can be respectively formed on the pin in a monolithic manner or manufactured separately and assembled on the pin. In further embodiments, the joints (625, 635) can also wholly or partly be displaced into the respectively adjacent assembly.

Figure 7:
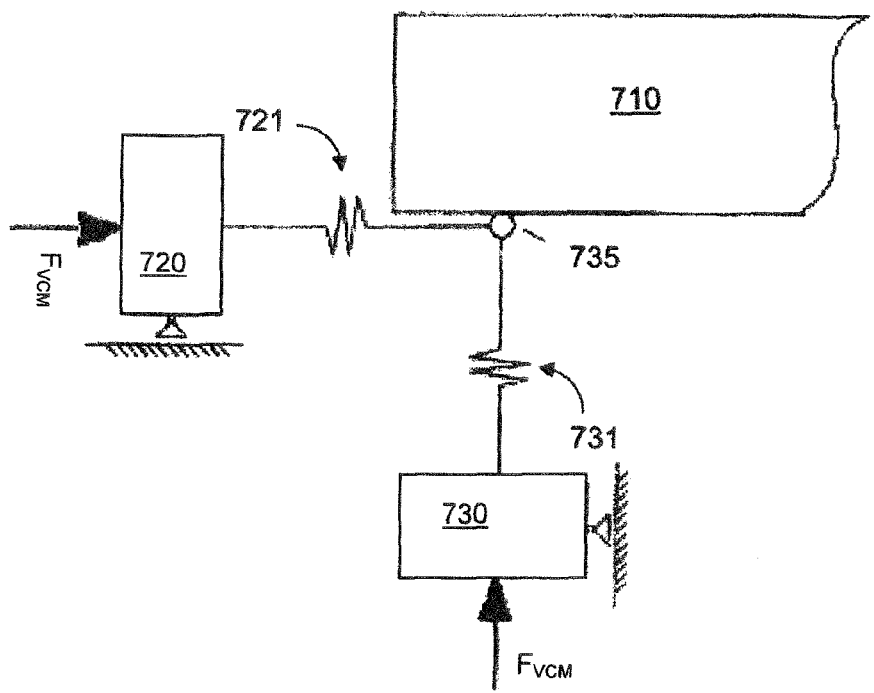

As another kinematic implementation, FIG. 7 schematically shows an embodiment in which joints on the actuator 720 and/or 730 are dispensed with by using a suitable guide. Here, the guide is embodied such that tilting about the axis perpendicular to the drive direction is not barred or blocked. A reduction of the tilting or flexing stiffness of the joints can be achieved by pretension (compressive stress in the longitudinal direction).

Figure 8:
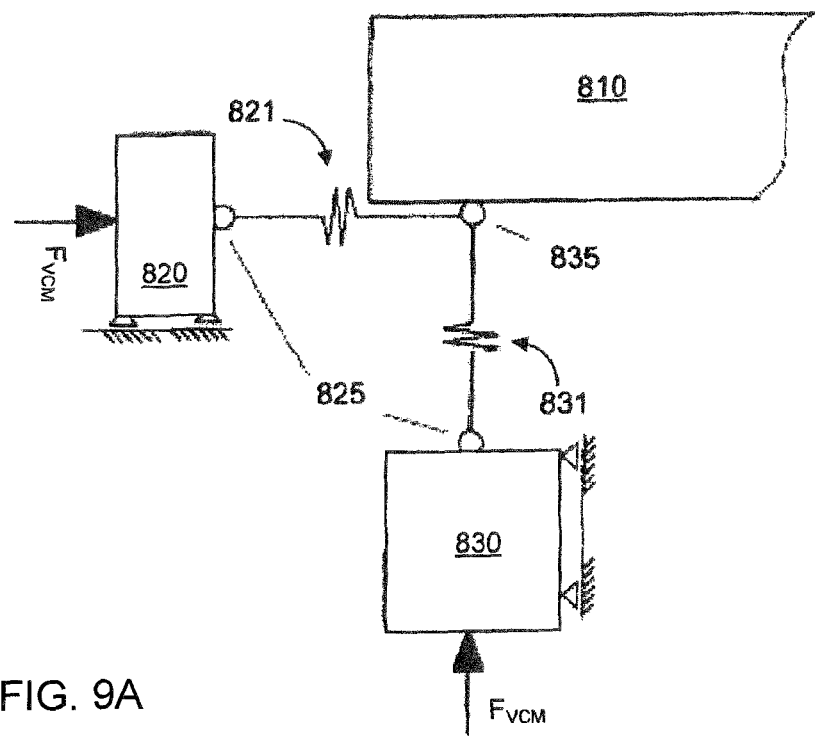

In a further embodiment, illustrated schematically in FIG. 8, it is also possible to integrate a weight-compensation device into one of the actuators, as a result of which the required drive power of the actuators can be kept comparatively low. To this end, a weight-compensation device is integrated into the actuator 830 in FIG. 8.

In further embodiments, the low-pass filter utilized as per the present invention can (alternatively or in addition thereto) also be formed by a sensor system present in the control loop (or can be formed therewith), with this sensor system comprising an elastic spring element.

Figure 9A:
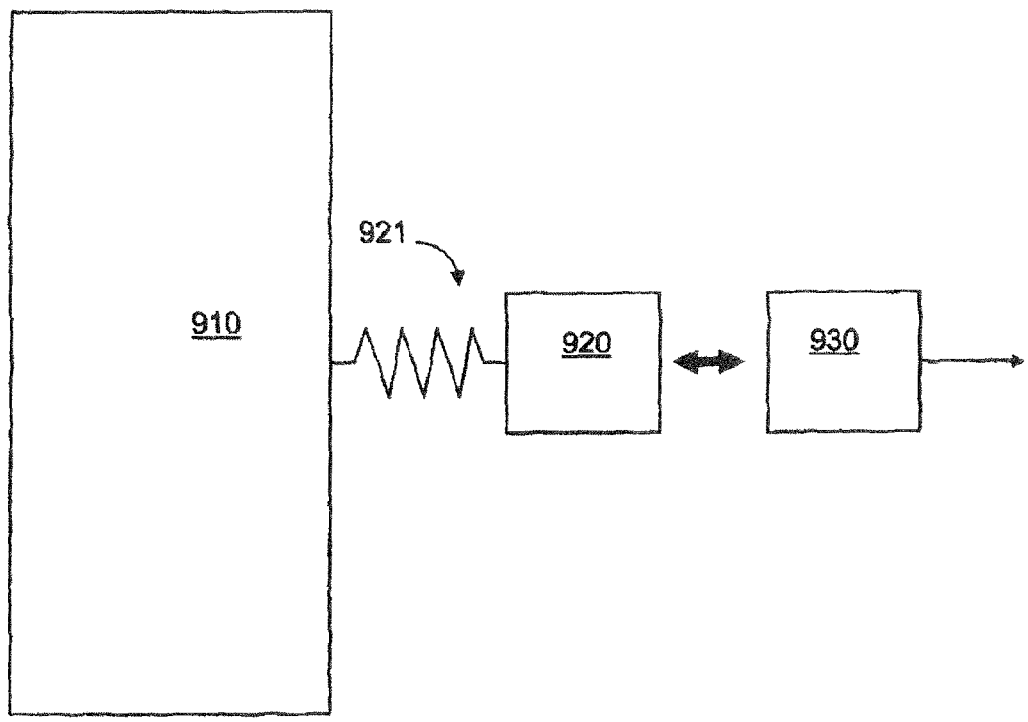

Such an arrangement is illustrated schematically in FIG. 9A. In the exemplary embodiment, a sensor target or a scale 920 is assembled on the mirror 910 via a suitable spring system, and it can be read by a sensor head 930, the sensor head outputting an appropriate sensor signal 931 that is characteristic for the mirror position. A mechanical filter is likewise realized as a result of the elastic connection of the sensor target or the sensor scale 920 on the mirror 910. In respect of preferred embodiments of this mechanical filter, reference is made to the explanations above, in conjunction with, in particular, FIGS. 4A to 4C and FIGS. 5A and 5B.

Figure 9B:
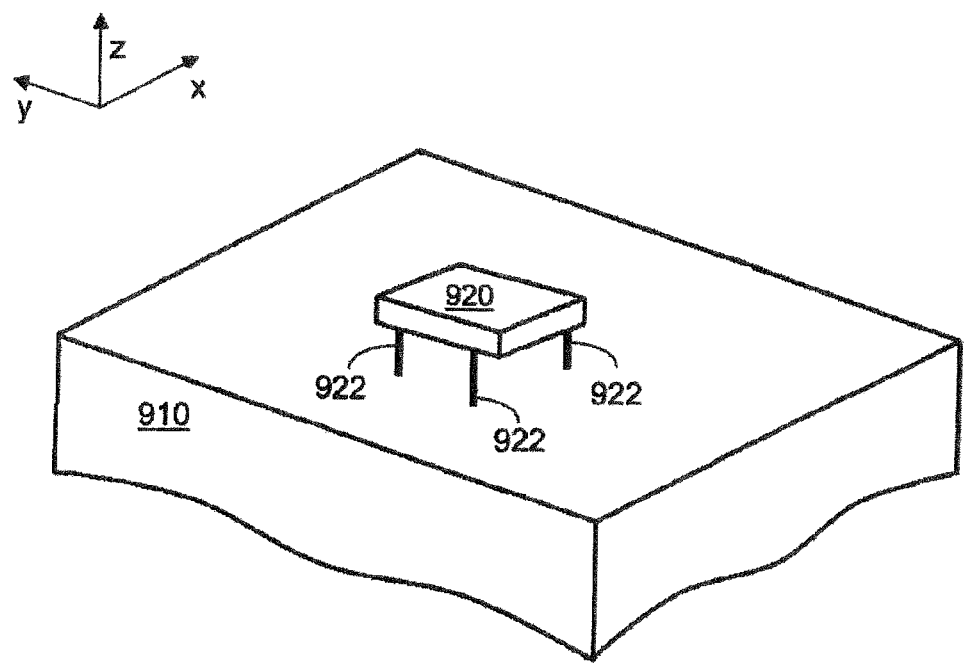

FIG. 9B shows, in a schematic illustration, a corresponding possible implementation of the mechanical filter, with the sensor scale 920 being attached to the mirror 910 over a number of laterally yielding elements (four in this example), for example, in the form of flexible arms 922, such that the sensor scale 920 can vibrate relative to the mirror 910. The yielding elements or flexible arms 922 are now designed in terms of their position and stiffness such that the resonant frequencies of the vibrations emerging in the x- and y-directions in the plotted coordinate system correspond. Additionally, the resonant frequency for the degree of freedom $R_z$, that is, the rotation about the z-axis, can also be constructed to correspond with the aforementioned resonant frequencies such that, as a result, the flexible arms 922 decouple with approximately the same natural frequency in their three lateral degrees of freedom (x, y, $R_z$), that is, the degrees of freedom that lie in the plane of the measurement direction. As a result, it is possible to ensure that the signal is filtered in all deflected positions of the mirror 910.

Although the invention was also described on the basis of special embodiments, various variations and alternative embodiments are accessible to a person skilled in the art, for example, by combining and/or replacing features of individual embodiments. Accordingly, a person skilled in the art understands that such variations and alternative embodiments are also comprised by the present invention, and the scope of the invention is only restricted within the meaning of the appended patent claims and the equivalents thereof.

It is understood that the foregoing description is that of the preferred embodiments of the invention and that various changes and modifications may be made thereto without departing from the spirit and scope of the invention as defined in the appended claims.

What is claimed is:

1. An arrangement for actuating an element in a microlithographic projection exposure apparatus, the arrangement comprising:
   first and second actuators;
   first and second mechanical couplings;
   said first and second actuators being coupled to said element via corresponding ones of said first and second mechanical couplings for applying respective forces to said element regulatable in at least one degree of freedom;
   said first and second actuators having first and second actuator masses, respectively;
   said first actuator mass and said first mechanical coupling conjointly defining a first mass-spring system operating as a first low-pass filter;
   said second actuator mass and said second mechanical coupling conjointly defining a second mass-spring system operating as a second low-pass filter; and,
   said first and second mass-spring systems having first and second natural frequencies deviating from each other by a maximum deviation equal to 10% of the largest of said first and second natural frequencies.

2. The arrangement according to claim 1, wherein said first and second actuators have mutually perpendicular drive axles.

3. The arrangement according to claim 2, wherein said two actuators form a bipod.

4. The arrangement according to claim 1, wherein the natural frequencies of said first and second mass-spring systems are less than 95% of the value of the smallest natural frequency of said element.

5. The arrangement according to claim 1, wherein the natural frequencies of said first and second mass-spring systems are less than 80% of the value of the smallest natural frequency of said element.

6. The arrangement according to claim 1, wherein the natural frequencies of said first and second mass-spring systems are less than 60% of the value of the smallest natural frequency of said element.

7. An arrangement for actuating an element in a microlithographic projection exposure apparatus, the arrangement comprising:
   an actuator;
   a mechanical coupling;
   said actuator being coupled to said element via said mechanical coupling to impart a force to said element regulatable in at least one degree of freedom;
   said actuator having an actuator mass;
   said actuator mass and said mechanical coupling conjointly defining a mass-spring system operating as a low-pass filter;
   said element having a natural frequency; and,
   said mass-spring system having a natural frequency less than 95% of the value of the smallest natural frequency of said element.

8. The arrangement according to claim 7, wherein said natural frequency of said mass-spring system is less than 80% of the value of the smallest natural frequency of said element.

9. The arrangement according to claim 7, wherein said natural frequency of said mass-spring system is less than 60% of the value of the smallest natural frequency of said element.

10. The arrangement according to claim 7, further comprising:
    a sensor for determining at least one of position and bearing of said element in at least one degree of freedom;
    a further mechanical coupling;
    said sensor being coupled to said element or to a reference structure via said further mechanical coupling; and,
    said sensor and said further mechanical coupling conjointly defining a mass-spring system operating as a low-pass filter.

11. An arrangement for actuating an element in a microlithographic projection exposure apparatus, the arrangement comprising:
    a sensor for determining at least one of position and bearing of said element in at least two degrees of freedom;
    a mechanical coupling;
    said sensor being coupled to said element or to a reference structure via said mechanical coupling;
    said sensor and said mechanical coupling conjointly defining first and second mass-spring systems for corresponding ones of said two degrees of freedom with said first and second mass-spring systems operating as respective low-pass filters; and, said first and second mass-spring systems having first and second natural frequencies deviating from each other by a maximum deviation equal to 10% of the largest of said first and second natural frequencies.

12. An arrangement for actuating an element in a microlithographic projection exposure apparatus, the arrangement comprising:
a sensor for determining at least one of the position and bearing of said element in at least one degree of freedom;
a mechanical coupling;
said sensor being coupled to said element or to a reference structure via said mechanical coupling;
said sensor and said mechanical coupling conjointly defining a mass-spring system acting as a low-pass filter; and,
said mass-spring system having a natural frequency less than 95% of the value of the smallest natural frequency of said element.

13. The arrangement according to claim 12, wherein said natural frequency of said mass-spring system is less than 80% of the value of the smallest natural frequency of said element.

14. The arrangement according to claim 12, wherein said natural frequency of said mass-spring system is less than 60% of the value of the smallest natural frequency of said element.

15. The arrangement according to claim 12, wherein the low-pass filter has a Q-factor of at least 5.

16. The arrangement according to claim 12, wherein the low-pass filter has a Q-factor of at least 20.

17. The arrangement according to claim 12, wherein the low-pass filter has a Q-factor of at least 50.

18. The arrangement according to claim 12, wherein the low-pass filter has a Q-factor of at least 80.

19. The arrangement according to claim 12, further comprising a closed-loop controller regulating forces applied to said element by said actuator as a function of a sensor signal characteristic for the position of said element with the control bandwidth being less than 1 kHz.

20. The arrangement according to claim 12, wherein said low-pass filter has a filter frequency lying in the range of 2-times to 15-times the bandwidth of the control loop.

21. The arrangement according to claim 12, wherein said low-pass filter has a filter frequency lying in the range of 100 Hz to 5 kHz.

22. The arrangement according to claim 12, wherein said element has a mass lying in the range of 500 g to 50 kg.

23. The arrangement according to claim 12, wherein said element has a mass lying in the range of 5 kg to 50 kg.

24. The arrangement according to claim 12, further comprising an actuator having a mass lying in the range of 20 g to 500 g.

25. The arrangement according to claim 12, wherein said mechanical coupling has a pin.

26. The arrangement according to claim 25, wherein said pin has at least one flexure bearing.

27. The arrangement according to claim 25, wherein said pin has at least two flexure bearings.

28. The arrangement according to claim 24, wherein said actuator is a Lorentz actuator.

29. The arrangement according to claim 12, further comprising six actuators for actuating said element in respective degrees of freedom.

30. The arrangement according to claim 12, wherein said element is a mirror.

31. The arrangement according to claim 12, wherein said element is an element in a microlithographic projection exposure apparatus designed for EUV.

32. A control loop in a microlithographic projection exposure apparatus including an element, the control loop comprising:
a position sensor for generating a sensor signal (Ua) characteristic of the position of said element in said projection exposure apparatus;
an actuator for applying a force to said element;
a closed-loop controller for regulating said force applied by said actuator to said element as a function of said sensor signal (Ua) from said position sensor; and,
a low-pass filter arranged in said control loop for stabilizing a control response,
wherein said low-pass filter has a filter frequency of less than 95% of the value of the smallest natural frequency of said element.

33. The control loop according to claim 32, wherein said low-pass filter has a Q-factor of at least 5.

34. The control loop according to claim 32, wherein said low-pass filter has a Q-factor of at least 20.

35. The control loop according to claim 32, wherein said low-pass filter has a Q-factor of at least 50.

36. The control loop according to claim 32, wherein said low-pass filter has a Q-factor of at least 80.

37. The control loop according to claim 32, wherein said low-pass filter has a filter frequency of less than 80% of the value of the smallest natural frequency of said element.

38. The control loop according to claim 32, wherein said low-pass filter has a filter frequency of less than 60% of the value of the smallest natural frequency of said element.

39. The control loop according to claim 32, wherein said low-pass filter is embodied as an electronic filter, analog electronic filter or digital electronic filter.

40. The control loop according to claim 39, wherein said low-pass filter has at least one electric or electronic circuit in the closed-loop controller, the position sensor or the actuator.

41. The control loop according to claim 32, wherein the low-pass filter is embodied as a mechanical filter made of yielding mechanical elements and inertial mechanical elements.

42. The control loop according to claim 41, wherein said yielding mechanical elements are springs and said inertial mechanical elements are masses.

43. The control loop according to claim 41, wherein said mechanical filter comprises said position sensor.

44. The control loop according to claim 41, wherein said mechanical filter comprises an actuator mass belonging to the actuator.

45. The control loop according to claim 44, wherein said actuator has an actuator mass and said mechanical filter comprises a mechanical coupling of said actuator mass to said element.

46. The control loop according to claim 45, wherein said mechanical coupling of the actuator mass to the element has a pin.

47. The control loop according to claim 45, wherein the ratio of the stiffness of the mechanical coupling in the axial direction with respect to the drive axle of the actuator, to the stiffness in the lateral direction is at least 100.

48. The control loop according to claim 46, wherein said pin is provided with two flexure bearings.

49. The control loop according to claim 32, wherein said actuator controlled by the closed-loop control has its own mechanical coupling to said element, with no further actuator coupling onto said mechanical coupling.

50. The control loop according to claim 32, wherein said element is a mirror.

51. The control loop according to claim 32, wherein said microlithographic projection exposure apparatus is configured for operation in EUV.

52. A microlithographic projection exposure apparatus comprising:
- an element;
- an arrangement for actuating said element;
- said arrangement including first and second actuators and first and second mechanical couplings;
- said first and second actuators being coupled to said element via corresponding ones of said first and second mechanical couplings for applying respective forces to said element regulatable in at least one degree of freedom;
- said first and second actuators having first and second actuator masses, respectively;
- said first actuator mass and said first mechanical coupling conjointly defining a first mass-spring system operating as a first low-pass filter;
- said second actuator mass and said second mechanical coupling conjointly defining a second mass-spring system operating as a second low-pass filter; and,
- said first and second mass-spring systems having first and second natural frequencies deviating from each other by a maximum deviation equal to 10% of the largest of said first and second natural frequencies.

53. A microlithographic projection exposure apparatus comprising:
- an element;
- a control loop including a position sensor for generating a sensor signal (Ua) characteristic of the position of said element in said projection exposure apparatus;
- an actuator for applying a force to said element;
- a closed-loop controller for regulating said force applied by said actuator to said element as a function of said sensor signal (Ua) from said position sensor; and,
- a low-pass filter arranged in said control loop for stabilizing a control response,
- wherein said low-pass filter has a filter frequency of less than 95% of the value of the smallest natural frequency of said element.

\* \* \* \* \*